United States Patent
Shin et al.

(10) Patent No.: US 9,391,615 B2
(45) Date of Patent: Jul. 12, 2016

(54) CLOCK MONITOR AND SYSTEM ON CHIP INCLUDING THE SAME

(71) Applicant: SAMSUNG ELECTRONICS CO., LTD., Suwon-Si, Gyeonggi-Do (KR)

(72) Inventors: Dong-Suk Shin, Seoul (KR); Ji-Yong Ahn, Anyang-Si (KR); Jang-Hyeon Lee, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/692,771

(22) Filed: Apr. 22, 2015

(65) Prior Publication Data

US 2016/0065215 A1 Mar. 3, 2016

(30) Foreign Application Priority Data

Aug. 26, 2014 (KR) .......................... 10-2014-0111545

(51) Int. Cl.
*G01R 23/02* (2006.01)
*H03K 19/00* (2006.01)
*H03K 5/19* (2006.01)
*H03L 7/18* (2006.01)

(52) U.S. Cl.
CPC .............. *H03K 19/0016* (2013.01); *H03K 5/19* (2013.01); *H03L 7/18* (2013.01)

(58) Field of Classification Search
CPC .......... G01R 23/02; G01R 23/15; H03K 5/19; H03K 19/0016
USPC ......................................... 327/39, 47, 48, 49
See application file for complete search history.

(56) References Cited

U.S. PATENT DOCUMENTS

| | | | |
|---|---|---|---|
| 6,195,758 B1* | 2/2001 | Lundh | H04J 3/0614 713/500 |
| 6,385,735 B1 | 5/2002 | Wilson et al. | |
| 7,356,726 B2 | 4/2008 | Shimoyama et al. | |
| 7,529,961 B2 | 5/2009 | Kondou | |
| 2002/0017926 A1 | 2/2002 | Saito | |
| 2007/0205737 A1* | 9/2007 | Lin | H02P 6/08 318/567 |
| 2008/0122491 A1* | 5/2008 | Kuan | H03D 13/005 327/43 |

(Continued)

FOREIGN PATENT DOCUMENTS

| | | |
|---|---|---|
| JP | 2828929 B | 9/1998 |
| JP | 2006-031133 A | 2/2006 |
| JP | 2009-026199 A | 2/2009 |

(Continued)

*Primary Examiner* — William Hernandez
(74) *Attorney, Agent, or Firm* — Volentine & Whitt, PLLC

(57) ABSTRACT

A system on chip includes a plurality of function blocks configured to perform predetermined functions, respectively, a clock control unit configured to generate a plurality of operating clock signals that are provided to the plurality of function blocks, respectively, a clock monitor configured to monitor frequencies of the operating clock signals to generate an interrupt signal, and a processor configured to control the frequencies of the operating clock signals based on the interrupt signal. The clock monitor includes a selector configured to select one of the operating clock signals to provide a selected clock signal, a frequency detector configured to detect a frequency of the selected clock signal to provide a detection frequency, and an interrupt generator configured to generate the interrupt signal based on the detection frequency, where the interrupt signal indicates a frequency abnormality of the operating clock signal corresponding to the selected clock signal.

20 Claims, 14 Drawing Sheets

(56) References Cited

U.S. PATENT DOCUMENTS

2010/0308868 A1* 12/2010 Zinke ............... G06F 11/1604 327/20
2012/0278020 A1* 11/2012 Antonesei .......... G01R 19/2513 702/75

FOREIGN PATENT DOCUMENTS

| | | |
|---|---|---|
| JP | 4463115 B | 2/2010 |
| JP | 2013-088281 A | 5/2013 |
| KR | 1999-0060348 A | 7/1999 |
| KR | 2002-0053492 A | 7/2002 |

* cited by examiner

| | FIMP | SCL | | | | FDET |
| --- | --- | --- | --- | --- | --- | --- |
| | | PL1 | PL2 | ... | PLn | |
| OCK1 | FI1 | S11 | S12 | ... | S1n | FD1 |
| OCK2 | FI2 | S21 | S22 | ... | S2n | FD2 |
| OCK3 | FI3 | S31 | S32 | ... | S3n | FD3 |
| ⋮ | ⋮ | ⋮ | ⋮ | ⋮ | ⋮ | ⋮ |
| OCKm | FIm | Sm1 | Sm2 | ... | Smn | FDm |

CLOCK MONITOR AND SYSTEM ON CHIP INCLUDING THE SAME

CROSS-REFERENCE TO RELATED APPLICATION

This U.S. Non-provisional application claims priority under 35 USC §119 to Korean Patent Application No. 10-2014-0111545, filed on Aug. 26, 2014, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a clock monitor and a system on chip including the clock monitor.

2. Discussion of the Related Art

Recently, large scale integrated circuits such as an application processor adopt a dynamic voltage and frequency scaling (DVFS) for low-power operations. As semiconductor manufacturing processes develop, one integrated circuit is designed to perform a number of operations and thus clock domains and/or power domains of the integrated circuit become complex.

The problems of system instability due to improper clock setting may be serious as the clock domain is more complex and frequency change is more frequent in the integrated circuit. In a real system development stage, the exact reason of a system irregularity may not be found and then the power supply voltage or the driving voltage is increased higher than the proper level to address the system irregularity, thereby unnecessarily increasing power consumption.

SUMMARY

At least one example embodiment of the inventive concept provides a clock monitor capable of efficiently monitoring frequencies of a plurality of operating clock signals.

At least one example embodiment of the inventive concept provides a system on chip including a clock monitor capable of efficiently monitoring frequencies of a plurality of operating clock signals.

According to example embodiments, a clock monitor includes a selector, a frequency detector and an interrupt generator. The selector selects one of a plurality of operating clock signals to provide a selected clock signal, where the plurality of operating clock signals are provided to a plurality of function blocks, respectively. The frequency detector detects a frequency of the selected clock signal to provide a detection frequency. The interrupt generator generates an interrupt signal based on the detection frequency, where the interrupt signal indicates a frequency abnormality of the operating clock signal corresponding to the selected clock signal.

The selector may include a multiplexer configured to output one of the operating clock signals as the selected clock signal in response to an operating clock selection signal.

A value of the operating clock selection signal may be changed sequentially such that the multiplexer outputs the operating clock signals sequentially as the selected clock signal.

The interrupt signal may indicate the frequency abnormality of the operating clock signals sequentially.

A value of the operating clock selection signal may be determined such that the multiplexer outputs the operating clock signal as the selected clock signal when a frequency of the operating clock signal is changed or a power level of the function block corresponding to the operating clock signal is changed.

The interrupt signal may indicate the frequency abnormality of the operating clock signal of which the frequency or the power level of the function block corresponding thereto is changed.

The frequency detector and the interrupt generator may be shared with respect to the operating clock signals such that the frequency abnormality of the operating clock signals is monitored sequentially.

The frequency detector may divide the frequency of the selected clock signal to provide the detection frequency.

The interrupt generator may determine the frequency abnormality of the operation clock signal corresponding to the selected clock signal by reflecting a power level of the function block corresponding to the selected clock signal.

The frequency detector may include a frequency divider configured to divide the frequency of the selected clock signal to generate a divided clock signal, a count enable signal generator configured to generate a count enable signal based on a reference clock signal, a clock counter configured to count a clock number of the divided clock signal during an activation time interval of the count enable signal to provide a count value, and a detection frequency calculator configured to calculate the detection frequency based on the count value.

The frequency divider may include at least one flip-flop configured to divide the frequency of the selected clock signal to generate at least one clock signal having a frequency lower than the frequency of the selected clock signal.

The frequency divider may include a first flip-flop configured to receive the selected clock signal and generate a first clock signal having a frequency corresponding to a half the frequency of the selected clock signal, a second flip-flop configured to receive the first clock signal and generate a second clock signal having a frequency corresponding to a half the frequency of the first clock signal, and a multiplexer configured to select one of the selected clock signal, the first clock signal and the second clock signal to output the divided clock signal in response to a division ratio selection signal.

The count enable signal generator may generate the count enable signal such that the activation time interval of the count enable signal corresponds to k times of a cyclic period of the reference clock signal where k is a positive integer.

The detection frequency calculator may calculate the detection frequency as $Fd=Fr*S*N/T$, where $Fd$ is the detection frequency of the operating clock frequency corresponding to the selected clock signal, $Fr$ is a frequency of the reference clock signal, $S$ is a division ratio of the frequency divider, $N$ is the count value and $T$ is the activation time interval of the count enable signal.

The interrupt generator may include a storage unit configured to store values of an implemented frequency corresponding to the operating clock signals respectively and scaling values corresponding to power levels of the function blocks respectively, a reference frequency calculator configured to extract the value of the implemented frequency and the scaling value corresponding to the selected clock signal from the storage unit and calculate a reference frequency based on the extracted value of the implemented frequency and the extracted scaling value, and a comparator configured to compare the reference frequency and the detection frequency to generate the interrupt signal.

The comparator may activate the interrupt signal when the detection frequency is higher than the reference frequency.

The storage unit may store values of the detection frequency detected by the frequency detector such that an external processor refers to the values of the detection frequency.

According to example embodiments, a system on chip includes a plurality of function blocks configured to perform predetermined functions, respectively, a clock control unit configured to generate a plurality of operating clock signals that are provided to the plurality of function blocks, respectively, a clock monitor configured to monitor frequencies of the operating clock signals to generate an interrupt signal, and a processor configured to control the frequencies of the operating clock signals based on the interrupt signal. The clock monitor includes a selector configured to select one of the operating clock signals to provide a selected clock signal, a frequency detector configured to detect a frequency of the selected clock signal to provide a detection frequency, and an interrupt generator configured to generate the interrupt signal based on the detection frequency, where the interrupt signal indicates a frequency abnormality of the operating clock signal corresponding to the selected clock signal.

The processor may reset the frequency of the operating clock signal corresponding to the selected clock signal when the interrupt signal is activated.

According to example embodiments, a system on chip operating based on a plurality of operating clock signals, includes, a clock monitor configured to monitor frequencies of the operating clock signals to generate an interrupt signal. The clock monitor includes a selector configured to select one of the operating clock signals to provide a selected clock signal, a frequency detector configured to detect a frequency of the selected clock signal to provide a detection frequency, and an interrupt generator configured to generate the interrupt signal based on the detection frequency, where the interrupt signal indicates a frequency abnormality of the operating clock signal corresponding to the selected clock signal.

The clock monitor and the system on chip including the clock monitor according to example embodiments may enhance the performance of the system without excessive increase of the system size by monitoring the plurality of operating clock signals using common hardware.

In addition, the clock monitor and the system on chip including the clock monitor according to example embodiments may monitor the operating clock signals exactly by reflecting the changes of the power level according to the DVFS approach.

Furthermore, the clock monitor and the system on chip including the clock monitor according to example embodiments may perform efficient clock monitoring, even when the frequency of the operating clock signal is relatively high, by counting the divided operating clock signal.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
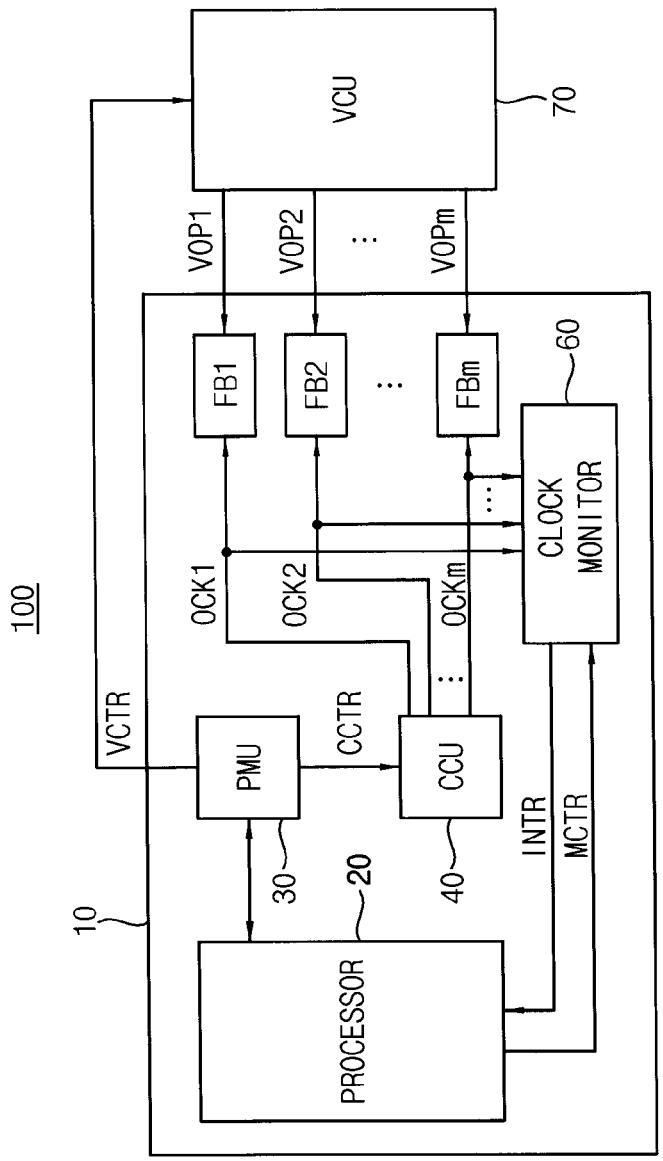
FIG. 1 is a block diagram illustrating a system according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a system according to example embodiments. Referring to FIG. 1, a system 100 may include an integrated circuit 10 and a voltage control unit (VCU) 70 (e.g., voltage controller or power controller). The integrated circuit 10 may include at least one processor 20, a power management unit (PMU) 30 (e.g., power manager), a clock control unit (CCU) 40 (e.g., clock controller), one or more function blocks FB11~FBm and a clock monitor 60.

The integrated circuit 10 may be a system on chip (SOC) in which various elements are integrated as one chip. The integrated circuit 10 may be powered by the voltage control unit 70. The voltage control unit 70 may include at least one voltage regulator. The voltage control unit 70 may be referred to as a power supply or a power management integrated circuit (PMIC). According to example embodiments, the voltage control unit 70 may be implemented as another chip distinct from the chip of the integrated circuit 10, or at least a portion of the voltage control unit 70 may be included in the integrated circuit 10.

Even though one processor 20 is illustrated in FIG. 1 for convenience of illustration, the integrated circuit 10 may further include one or more processors or processing units. The processor 20 may be a central processing unit (CPU) for performing main functions of the integrated circuit 10. The processor 20 may be configured to perform program instructions, such as those of an operating system (OS).

The power management unit 30 may monitor the operating status or the operating condition of the integrated circuit 10 to determine an operating power level corresponding to the present operating condition. The power level may be represented by at least one of the operating voltage and the operating frequency. In other words, the power level may be changed by changing at least one of the operating voltage and the operating frequency. The operating voltage may be the power supply voltage and the operating frequency may be the frequency of the operating clock signal.

The power management unit 30 may monitor the operating status or the operating condition such as the workload, the operating temperature, etc., of the integrated circuit 10 to determine the operating power level corresponding to the present operating condition. For example, when the workload of the integrated circuit 10 increases, the power management unit 30 may raise the operating power level to increase the operating voltage and/or the operating frequency. In contrast, when the workload of the integrated circuit 10 decreases, the power management unit 30 may lower the operating power level to decrease the operating voltage and/or the operating frequency. When the operating temperature increases out of a normal operation range, the operating power level may be decreased to decrease the operating voltage and/or the operating frequency. The performance of the integrated circuit 10 may be enhanced by increasing the operating power level and unnecessary power consumption may be prevented by lowering the operating power level. In some example embodiments, the power management unit 30 may determine the operating power level by monitoring an operating status or an operating condition (e.g., the workload) of the processor 20. In other example embodiments, the processor 20 may monitor its own workload and request a change of the operating power level to the power management unit 30.

The power management unit 30 may generate a voltage control signal VCTR and a clock control signal CCTR, and the voltage control unit 70 and the clock control unit 40 may provide the operating voltage and the operating frequency corresponding to the determined operating power level in response to the generated voltage control signal VCTR and the generated clock control signal CCTR, respectively. The operating power level may be altered by changing at least one of the operating voltage and the operating frequency. In example embodiments, the power management unit 30 may control the power level of a portion of the integrated circuit 10 independently of the power level of another portion of the integrated circuit 10. For example, when the function blocks FB1~FBm are included in different power domains, the operating voltages VOP1~VOPm provided to the function blocks FB1~FBm may be controlled independently. In addition, when the function blocks FB1~FBm are included in different clock domains, the operating clock signals OCK1~OCKm provided to the function blocks FB1~FBm may be controlled independently.

The function blocks FB1~FBm may perform predetermined functions and the function blocks may be referred to as intellectual property cores or IP cores. For example, the function blocks FB1~FBm may include a memory controller, a central processing unit (CPU), a display controller, a file system block, a graphic processing unit (GPU), an image signal processor (ISP), a multi-format codec block (MFC), etc. The processor 20 and the power management unit 30 may be the independent function blocks, respectively.

The clock control unit 40 may generate the operating clock signals that are provided to the function blocks FB1~FBm, respectively. The clock control unit 40 may include at least one of a phase-locked loop (PLL), a delay-locked loop (DLL), a clock multiplier, and a clock diver. The clock control unit 40 is further described below referring to FIG. 13.

The clock monitor 60 monitors the frequencies of the operating clock signals OCK1~OCKm to generate an interrupt signal INTR. The clock monitor 60 is further described with reference to FIG. 2. The processor 20 may generate a monitor control signal MCTR to control the clock monitor 60. In addition, the processor 20 may control the frequencies of the operating control signals OCK1~OCKm based on the interrupt signal INTR.

The operating voltage and the clock signal provided to the processor 20 and the power management unit 30 are omitted in FIG. 1 for convenience of illustration, and the number of the memory devices may be varied. At least one of the power management unit 30 and the function blocks FB1~FBm may be included in the same power domain as the processor 20. The power management unit 30 may be included in the processor 20.

Figure 2:
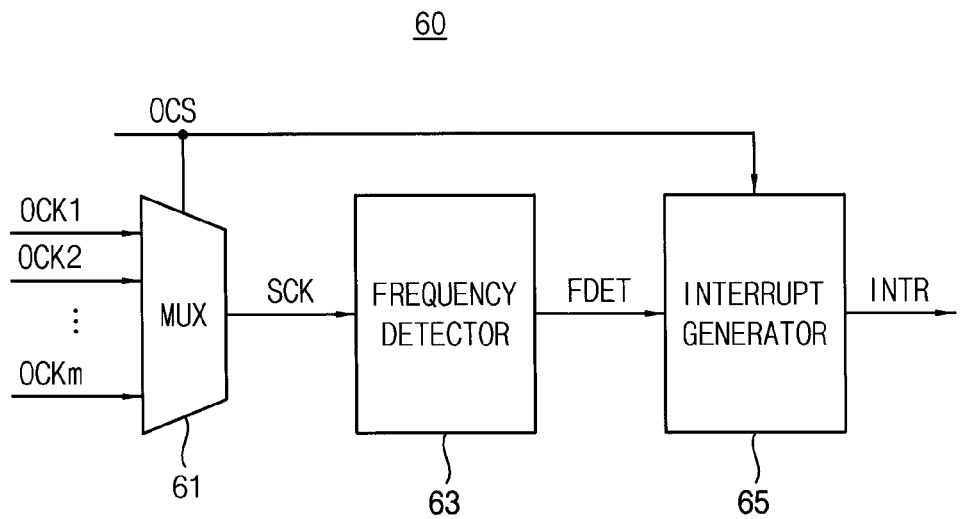
FIG. 2 is a block diagram illustrating a clock monitor according to example embodiments.

FIG. 2 is a block diagram illustrating a clock monitor according to example embodiments. Referring to FIG. 2, a clock monitor 60 may include a selector MUX 61, a frequency detector 63 and an interrupt generator 65.

The selector 61 may select one of a plurality of operating clock signals OCK1~OCKm, which are provided to a plurality of function blocks FB1~FBm in FIG. 1, respectively, to provide a selected clock signal SCK. The frequency detector 63 may detect a frequency of the selected clock signal SCK to provide a detection frequency FDET. The interrupt generator 65 may generate an interrupt signal INTR based on the detection frequency FDET, such that the interrupt signal INTR may indicate a frequency abnormality of the operating clock signal corresponding to the selected clock signal SCK.

As illustrated in FIG. 2, the selector 61 may include a multiplexer configured to output one of the operating clock signals OCK1~OCKm as the selected clock signal SCK in response to an operating clock selection signal OCS. The operating clock selection signal OCS may be included in the monitor control signal MCTR provided from the processor 20 in FIG. 1.

Figure 12:
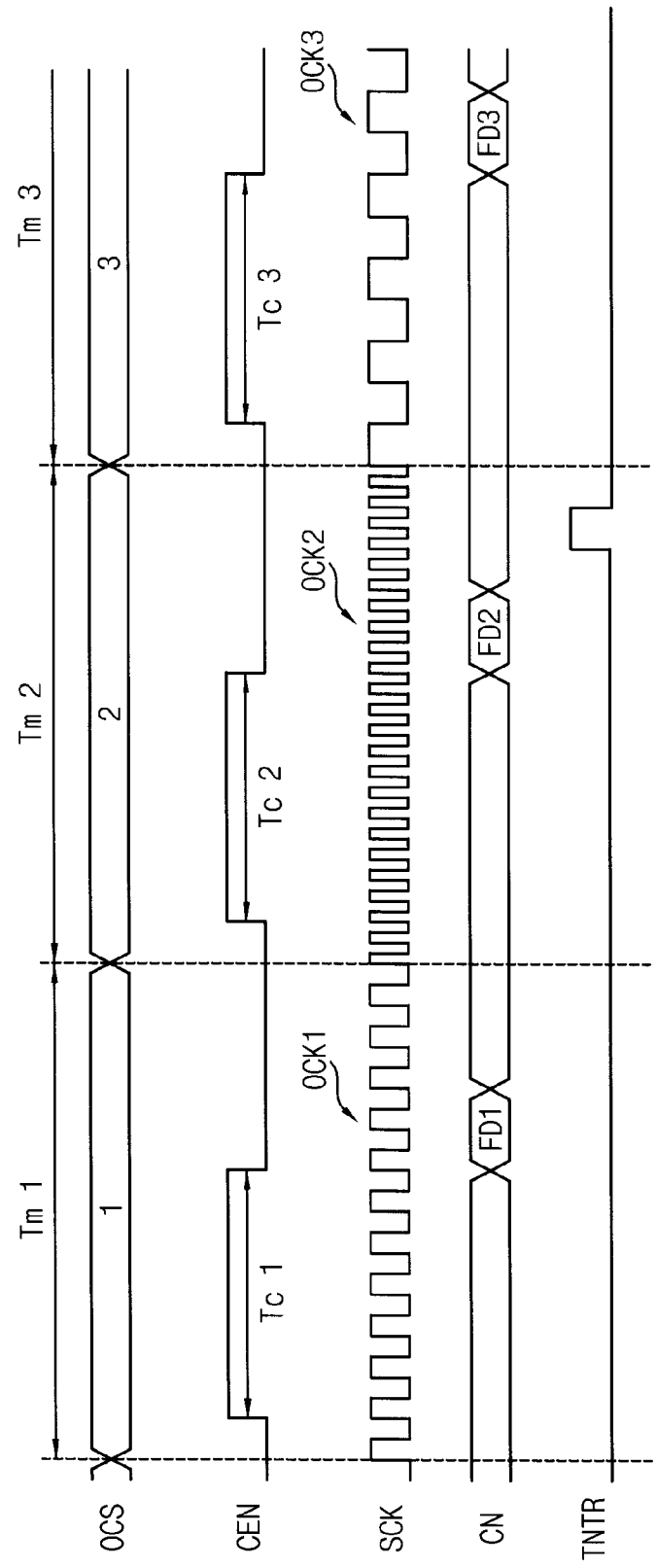
FIG. 12 is a timing diagram illustrating an example of overall operations of a clock monitor according to example embodiments.

In some example embodiments, as illustrated in FIG. 12, the processor 20 may change a value of the operating clock selection signal OCS sequentially such that the multiplexer 61 may output the operating clock signals OCK1~OCKm sequentially as the selected clock signal SCK. In this case, the interrupt signal INTR may indicate the frequency abnormality of the operating clock signals OCK1~OCKm sequentially.

In other example embodiments, the processor 20 may determine the value of the operating clock selection signal OCS such that the multiplexer 61 may output the operating clock signal as the selected clock signal SCK when a frequency of the operating clock signal is changed or a power level of the function block corresponding to the operating clock signal is changed. In this case, the interrupt signal INTR may indicate the frequency abnormality of the operating clock signals the frequency of which or the power level of the function block corresponding to which is changed.

As illustrated in FIG. 2, the frequency detector 63 and the interrupt generator 65 may be shared with respect to the operating clock signals OCK1~OCKm such that the frequency abnormality of the operating clock signals may be monitored sequentially. As such, the clock monitor and the system on chip including the clock monitor according to example embodiments may enhance the performance of the system without excessive increase of the system size by monitoring the plurality of operating clock signals using common hardware.

The frequency detector 63 is further described with reference to FIGS. 3 through 9. As will be described below, the frequency detector 63 may divide the frequency of the selected clock signal SCK to provide the detection frequency FDET. As such, the clock monitor and the system on chip including the clock monitor according to example embodiments may perform efficient clock monitoring, even when the frequency of the operating clock signal is relatively high, by counting the divided operating clock signal.

The interrupt generator 65 is further described with reference to FIGS. 10 and 11. As will be described below, the interrupt generator 65 may determine the frequency abnormality of the operation clock signal corresponding to the selected clock signal SCK by reflecting a power level of the function block corresponding to the selected clock signal SCK. As such, the clock monitor and the system on chip including the clock monitor according to example embodiments may monitor the operating clock signals accurately by reflecting the changes of the power level according to the DVFS scheme.

Figure 3:
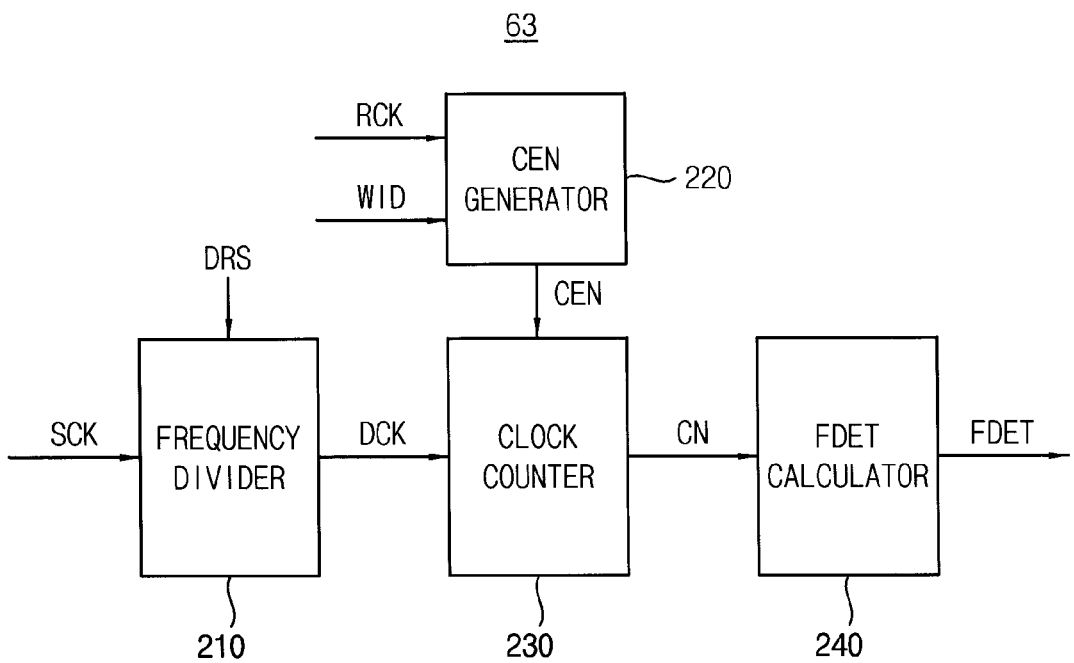
FIG. 3 is a block diagram illustrating an example embodiment of a frequency detector included in the clock monitor of FIG. 2.

FIG. 3 is a block diagram illustrating an example embodiment of a frequency detector included in the clock monitor of FIG. 2. Referring to FIG. 3, a frequency detector 63 may include a frequency divider 219, a count enable signal generator 220, a count enable signal generator 230 and a detection frequency calculator 240.

The frequency divider 210 may divide the frequency of the selected clock signal SCK to generate a divided clock signal DCK. The count enable signal generator 229 may generate a count enable signal CEN based on a reference clock signal RCK. The clock counter 230 may count a clock number of the divided clock signal DCK during an activation time interval of the count enable signal CEN to provide a count value CN. The detection frequency calculator 240 may calculate the detection frequency FDET based on the count value CN.

As will be described below with reference to FIGS. 4 through 8, the frequency divider may include at least one flip-flop configured to divide the frequency of the selected clock signal SCK to generate at least one clock signal having a frequency lower than the frequency of the selected clock signal SCK. The frequency divider 210 may select the one divided clock signal as the selected clock signal SCK in response to a division ratio selection signal DRS. The division ratio selection signal DRS may be included in the monitor control signal MCTR provided from the processor 20 in FIG. 1. As described above, the efficient clock monitoring may be performed by counting the clock number of the divided clock signal even though the operating clock signal has the relatively high frequency.

Figure 9:
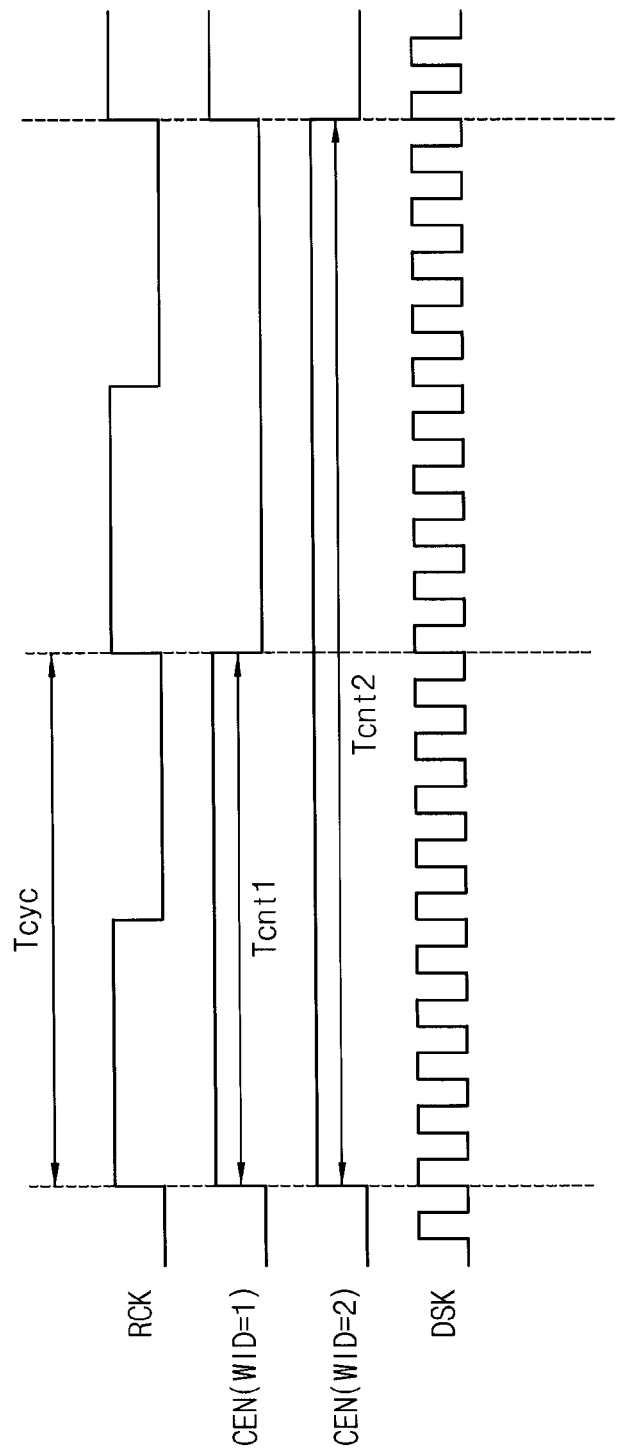
FIG. 9 is a timing diagram illustrating an example operation of a count enable signal generator included in the frequency detector of FIG. 3.

The reference clock signal RCK may have a frequency that is substantially fixed regardless of the operating voltage and the operating temperature. In general, the application processor or the system on chip may receive a clock signal of a fixed frequency (e.g., about 24 MHz) from a crystal oscillator, and the reference clock signal RCK may be a clock signal from the crystal oscillator. In some example embodiments, the count enable signal generator 220 may control the activation time interval of the count enable signal CEN based on a signal width value WID. The signal width value WID may be included in the monitor control signal MCTR provided from the processor 20 in FIG. 1. For example, as illustrated in FIG. 9, the count enable signal generator 220 may generate the count enable signal CEN such that the activation time interval of the count enable signal CEN may correspond to k times of a cyclic period of the reference clock signal RCK where k is a positive integer.

Figure 4:
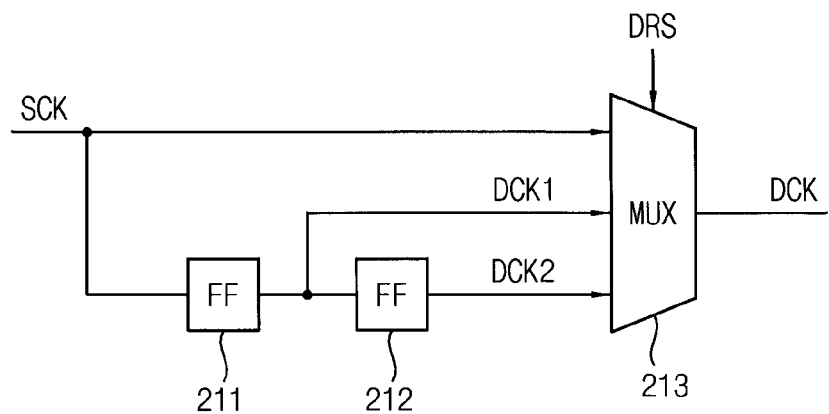
FIG. 4 is a block diagram illustrating an example embodiment of a frequency divider included in the frequency detector of FIG. 3.

FIG. 4 is a block diagram illustrating an example embodiment of a frequency divider included in the frequency detector of FIG. 3. Referring to FIG. 4, a frequency divider 210 may include a first flip-flop FF 211, a second flip-flop 212 and a multiplexer MUX 213.

The first flip-flop 211 may receive the selected clock signal SCK and generate a first clock signal DCK1 having a frequency corresponding to a half the frequency of the selected clock signal SCK. The second flip-flop 212 may receive the first clock signal DCK1 and generate a second clock signal DCK2 having a frequency corresponding to a half the frequency of the first clock signal DCK. The multiplexer 213 may select one of the selected clock signal SCK, the first clock signal DCK and the second clock signal DCK2 to output the divided clock signal DCK in response to a division ratio selection signal DRS. The configuration of FIG. 4 is a non-limiting example and the configuration of the frequency divider 210 may vary. For example, the frequency divider may include only one flip-flop to output the first clock signal DCK1 and the frequency divider may select one of the selected clock signal SCK and the first clock signal DCK1 as the divided clock signal DCK.

The division ratio selection signal DRS may be included in the monitor control signal MCTR that is provided from the processor 20 in FIG. 1. The processor 20 may adjust the value of the division ratio selection signal DRS based on the frequency of the selected clock signal SCK such that the multiplexer 212 selects the selected clock signal SCK when the frequency of the selected clock signal SCK is relatively high and selects one of the clock signals DCK1 and DCK2 having the lowered frequencies when the frequency of the selected clock signal SCK is relatively low. Using such frequency divider 210, the clock monitor and the system on chip including the clock monitor according to example embodiments may perform efficient clock monitoring, even when the frequency of the operating clock signal is relatively high, by counting the divided operating clock signal.

Figure 5:
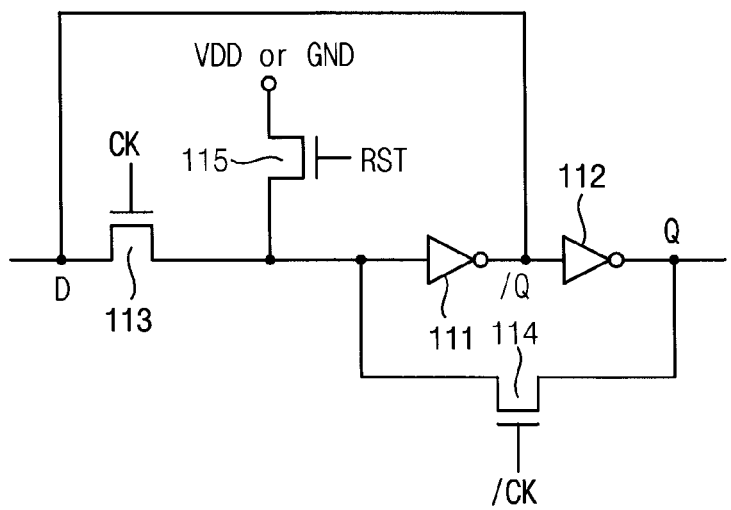
FIG. 5 is a circuit diagram illustrating an example of a positive-edge triggered flip-flop.
Figure 6:
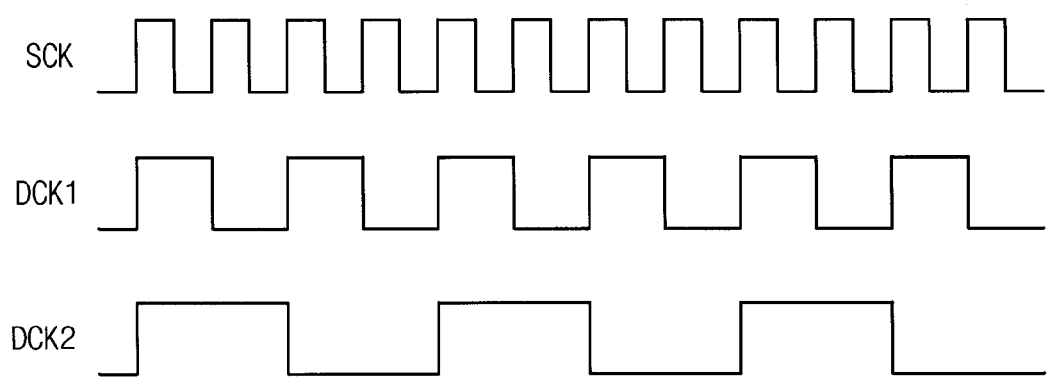
FIG. 6 is a timing diagram illustrating an example operation of a frequency divider using the positive-edge triggered flip-flop of FIG. 5.

FIG. 5 is a circuit diagram illustrating an example of a positive-edge triggered flip-flop, and FIG. 6 is a timing diagram illustrating an example operation of a frequency divider using the positive-edge triggered flip-flop of FIG. 5. Referring to FIG. 5, the positive-edge triggered flip-flop may include a first inverter 111, a second inverter 112, a first switch 113 and a second switch 114.

In some example embodiments, the output of the first inverter 111 is coupled to the input of the second inverter 112, and the output of the second inverter 112 is coupled to the input of the first inverter 111 via the second switch 114, thereby forming a latch. In the example embodiment of FIG. 5, the output of the first inverter 111 corresponds to an inversion output terminal /Q and the output of the second inverter 112 corresponds to a non-inversion output terminal Q. The first switch 113 is coupled between a data terminal D and the input of the first inverter 111 and the control terminal CK of the first switch 113 corresponds to a clock terminal. A clock signal CLK is applied to the control terminal CK of the first switch 113 and an inversion signal /CLK of the clock signal CLK is applied to the control terminal /CK of the second switch 114.

The positive-edge triggered flip-flop of FIG. 5 may further include a reset switch 115 for initializing the state of the flip-flop. When the reset switch 115 is turned on in response to a reset signal RST, the inversion output terminal /Q and the output terminal Q may be initialized respectively to logic low or logic high depending on the reset voltage.

When the clock signal CLK applied to the control terminal CK is logic low, the flip-flop of FIG. 5 is in a storage state that does not change even though the logic level of the data terminal D is changed. When the clock signal CLK transitions from logic low to logic high, that is, at the rising edge of the clock signal CLK, the logic level of the data terminal D is transferred into the non-inversion output terminal Q. A flip-flop for which the logic state is determined in synchronization with the edge of the signal applied to the clock terminal CK may be referred to as an edge triggered flip-flop, and the flip-flop of FIG. 5 may be a positive-edge triggered flip-flop.

The positive-edge triggered flip-flop may toggle when the inversion output terminal /Q is coupled to the data terminal D. When the clock signal CLK applied to the control terminal CK transitions to logic low, the second switch 114 is turned on and the data terminal D is set to logic level opposite to the non-inversion output terminal Q, but the state of the flip-flop is not changed since the first switch 113 is turned off. When the clock signal CLK transitions to logic high, the first switch 113 is turned on and logic level of the inversion output terminal is applied to the input of the first inverter 111, thereby inverting the logic state of the non-inverting output terminal Q. As such, the positive-edge triggered flip-flop toggles by inverting the storage state from logic high to logic low or from logic low to logic high at the rising edge of the clock signal CLK applied to the control terminal CK.

Using the positive-edge triggered flip-flop, the first clock signal DCK1 toggling in response to the rising edges of the selected clock signal SCK and the second clock signal DCK2 toggling in response to the rising edges of the first clock signal DCK1 may be generated as illustrated in FIG. 6. As a result, the first clock signal DCK1 may have a frequency corresponding to a half the frequency of the selected clock signal SCK, and the second clock signal DCK2 may have a frequency corresponding to a half the frequency of the first clock signal DCK1.

Figure 7:
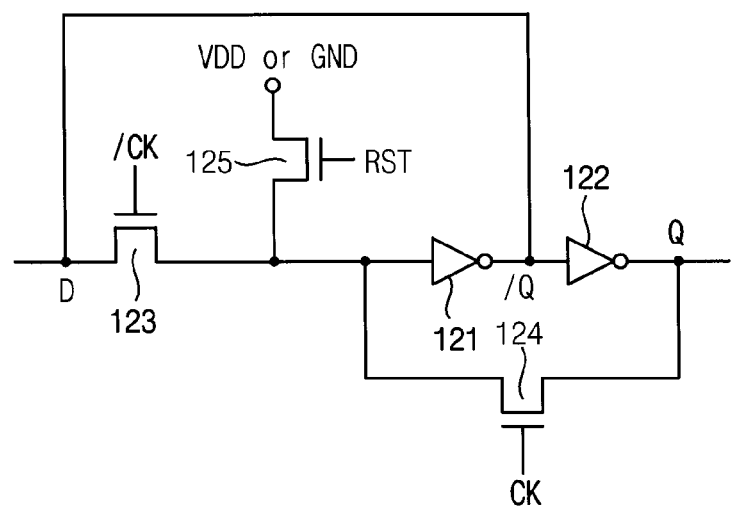
FIG. 7 is a circuit diagram illustrating an example of a negative-edge triggered flip-flop.
Figure 8:
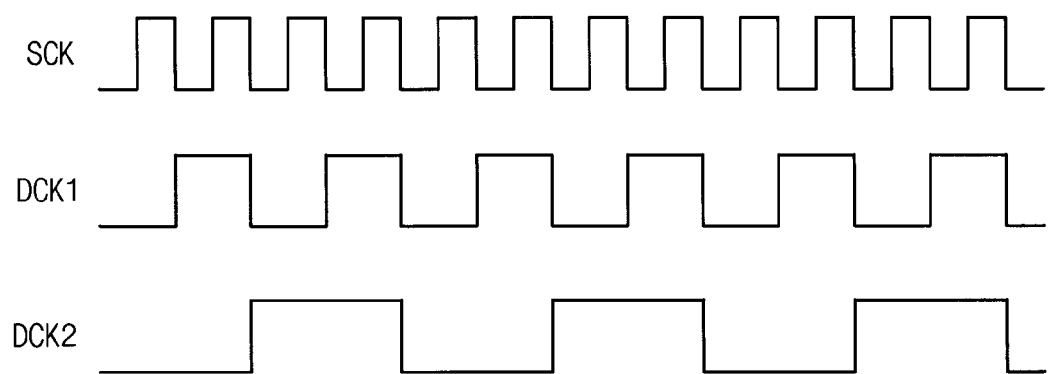
FIG. 8 is a timing diagram illustrating an example operation of a frequency divider using the negative-edge triggered flip-flop of FIG. 7.

FIG. 7 is a circuit diagram illustrating an example of a negative-edge triggered flip-flop, and FIG. 8 is a timing diagram illustrating an example operation of a frequency divider using the negative-edge triggered flip-flop of FIG. 7. Referring to FIG. 7, the negative-edge triggered flip-flop has a configuration similar to the positive-edge triggered flip-flop of FIG. 5, but the inversion signal /CLK of the clock signal CLK is applied to the control gate /CK of the first switch 123 and the clock signal CLK is applied to the control gate CK of the second switch 124. That is, the flip-flops of FIGS. 5 and 7 are different in that the control terminals CK and /CK are exchanged.

The negative-edge triggered flip-flop of FIG. 7 toggles in response to the falling edges of the clock signal CLK, whereas the positive-edge triggered flip-flop of FIG. 5 toggles in response to the rising edges of the clock signal CLK. When the clock signal CLK applied to the control terminal CK transitions to logic high, the second switch 124 is turned on and the data terminal D is set to logic level opposite to the non-inversion output terminal Q but the state of the flip-flop is not changed since the first switch 123 is turned off. When the clock signal CLK transitions to logic low, the first switch 123 is turned on and logic level of the inversion output terminal is applied to the input of the first inverter 111, thereby inverting the logic state of the non-inverting output terminal Q. As such, the negative-edge triggered flip-flop toggles by inverting the storage state from logic high to logic low or from logic low to logic high at each falling edge of the clock signal CLK applied to the control terminal CK.

Using the negative-edge triggered flip-flop, the first clock signal DCK1 toggling in response to the falling edges of the selected clock signal SCK and the second clock signal DCK2 toggling in response to the falling edges of the first clock signal DCK1 may be generated as illustrated in FIG. 8. As a result, the first clock signal DCK1 may have a frequency corresponding to a half the frequency of the selected clock signal SCK, and the second clock signal DCK2 may have a frequency corresponding to a half the frequency of the first clock signal DCK1.

FIG. 9 is a timing diagram illustrating an example operation of a count enable signal generator included in the frequency detector of FIG. 3. Referring to FIGS. 3 and 9, the count enable signal generator 220 may generate the count enable signal CEN such that the activation time interval of the count enable signal CEN may correspond to k times of a cyclic period Tcyc of the reference clock signal RCK where k is a positive integer. For example, the activation time interval Tcnt1 may be the same as the cyclic period Tcyc of the reference clock signal RCK when the signal width value WID is one (1), and the activation time interval Tcnt2 may be double the cyclic period Tcyc of the reference clock signal RCK when the signal width value WID is two (2).

As such, the count enable signal generator 220 may control the activation time interval of the count enable signal CEN based on the signal width value WID. The count enable signal generator 220 may include the flip-flops as illustrated in FIGS. 5 and 7 to generate the divided count enable signal CEN. The clock counter 230 may count the clock number of the divided clock signal DCK during the activation time interval of the count enable signal CEN to provide the count value CN. The count value CN and the accuracy of counting may be increased as the activation time interval of the count enable signal CEN is increased.

The detection frequency calculator 240 may calculate the detection frequency FDET as following Equation1.

$$Fd = Fr*S*N/T \qquad \text{Equation1:}$$

In Equation1, Fd is the detection frequency FDET of the operating clock frequency corresponding to the selected clock signal SCK, Fr is a frequency of the reference clock signal RCK, and S is a division ratio of the frequency divider 210. Regarding the frequency divider 210 of FIG. 4, $S=2^0=1$ when the selected clock signal SCK is selected as the division clock signal DCK, $S=2^1=2$ when the first clock signal DCK1 is selected as the division clock signal DCK, and $S=2^2=4$ when the second clock signal DCK2 is selected as the division clock signal DCK. In Equation1, N is the count value CN and T is the activation time interval of the count enable signal CEN. As described above, the frequency divider 210 may adjust the division ratio S based on the division ratio selection signal DRS from the processor 20, and the count enable signal generator 220 may adjust the activation time interval T of the count enable signal CEN based on the signal width value WID provided from the processor 20. As such, the efficient frequency detection may be performed by adjusting the division ratio S and/or the activation time interval T.

Figures 10, 11:
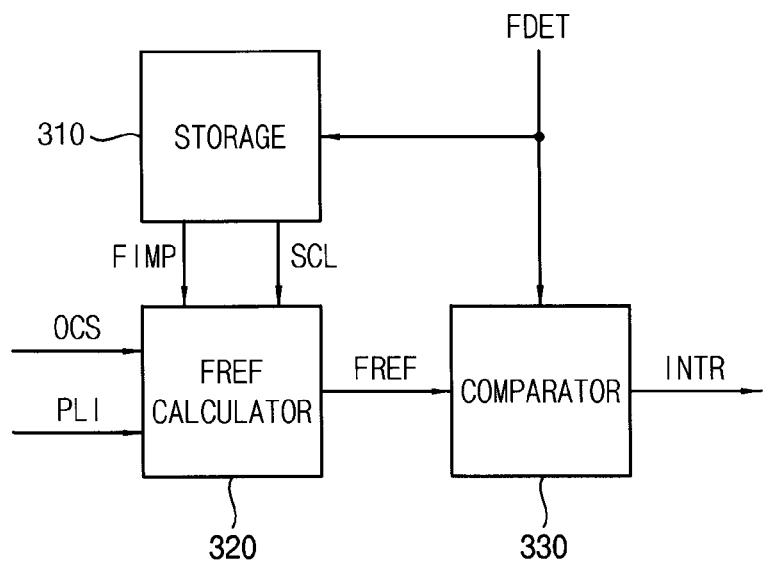
FIG. 10 is a block diagram illustrating an example embodiment of an interrupt generator included in the clock monitor of FIG. 2.
FIG. 11 is a diagram illustrating an example of a lookup table stored in the interrupt generator of FIG. 10.

FIG. 10 is a block diagram illustrating an example embodiment of an interrupt generator included in the clock monitor of FIG. 2, and FIG. 11 is a diagram illustrating an example of a lookup table stored in the interrupt generator of FIG. 10.

Referring to FIG. 10, an interrupt generator 65 may include a storage unit 310, a reference frequency calculator 320 and a comparator 330.

The storage unit 310 may store values FI1~FIm of an implemented frequency FIMP corresponding to the operating clock signals OCK1~OCKm respectively and scaling values S11~Smn corresponding to power levels PL1~PLn of the function blocks FB1~FBm respectively as illustrated in FIG. 11. For example, the storage unit 310 may be implemented in a form of a register and the storage unit 310 may be referred to as a special function register (SFR). The reference frequency calculator 320 may extract the value of the implemented frequency FIMP and the scaling value SCL corresponding to the selected clock signal SCK from the storage unit 310. The reference frequency calculator 320 may calculate a reference frequency FREF based on the extracted value of the implemented frequency FIMP and the extracted scaling value SCL. The comparator 330 may compare the reference frequency FREF and the detection frequency FDET to generate the interrupt signal INTR. As illustrated in FIG. 11, the storage unit may store the values FD1~FDm of the detection frequency FDET detected by the frequency detector 63 so that the processor 20 may refer to the values FD1~FDm of the detection frequency FDET.

The change of the operating voltages VOP1~VOPm, which are provided to the function blocks FB1~FBm in FIG. 1, may affect the operations of the function blocks FB1~FBm. For example, at least one of the function blocks FB1~FBm may include an embedded memory. In this case, the read operation of the embedded takes a longer time as the operating voltage is decreased. In the read operation of the memory, the develop time is required so that the data bit is transferred from the memory cell to the bit line, and the develop time depends on the operating voltage. As such, the required develop time may be decreased as the operating voltage is increased and the required develop time may be increased as the operating voltage is decreased.

The reference frequency calculator 320 may calculate the reference frequency FREF by multiplying the extracted value of the implemented frequency FIMP and the extracted scaling value SCL. The values FI1~FIm of the implemented frequency FIMP may be determined through static timing analysis (STA). The scaling values S11~Smn may be determined through silicon estimation, etc. and the scaling values S11~Smn may be increased as the power level is increased. Even though FIG. 11 illustrates the different scaling values with respect to the operating clock signals OCK1~OCKm, the scaling values may be set to the same value with respect to the same power level. As such, the frequency abnormality of the operating clock signal corresponding to the selected clock signal SCK may be determined by reflecting the power level of the function block corresponding to the selected clock signal SCK and thus the operating clock signals OCK1~OCKm may be monitored further exactly.

The comparator 330 may activate the interrupt signal INTR when the detection frequency FDET is higher than the reference frequency FREF. The processor 20 in FIG. 1 may prevent the system irregularity due to the improper clock frequency setting based on the interrupt signal INTR. For example, when the interrupt signal INTR is activated, the processor 20 may stop the operation of the corresponding function block or may lower the frequency of the corresponding operating clock signal.

FIG. 12 is a timing diagram illustrating an example of overall operations of a clock monitor according to example embodiments.

Referring to FIGS. 1, 2 and 12, the processor 20 may change the value of the operating clock selection signal OCS sequentially so that the multiplexer or the selector 61 may output the operating clock signals OCK1, OCK2 and OCK3 sequentially as the selected clock signal SCK. For example, the processor 20 may set the value of the operating clock selection signal OCS to 1 during a first monitoring period Tm1, set the value of the operating clock selection signal OCS to 2 during a second monitoring period Tm2, and set the value of the operating clock selection signal OCS to 3 during a third monitoring period Tm3.

In response to the operating clock selection signal, the selector 61 may output the first operating clock signal OCK1 as the selected clock signal SCK during the first monitoring period Tm1, output the second operating clock signal OCK2 as the selected clock signal SCK during the second monitoring period Tm2 and output the third operating clock signal OCK3 as the selected clock signal SCK during the third monitoring period Tm3.

The frequency detector 63 may count the clock numbers of the selected clock signal SCK during the respective activation time intervals Tc1, Tc2 and Tc3 of the count enable signal CEN to provide the values FD1, FD2 and FD3 of the detection frequency FDET based on the clock numbers. The activation time intervals Tc1, Tc2 and Tc3 of the count enable signal CEN may be different or the same with respect to the monitoring periods Tm1, Tm2 and Tm3.

The interrupt generator 65 may compare the values FD1, FD2 and FD3 of the detection frequency FDET with the values of the reference frequency FREF to determine whether to activate the interrupt signal INTR. In this case, the interrupt signal INTR may indicate the frequency abnormality of the operating clock signals OCK1, OCK2 and OCK3 sequentially. FIG. 12 illustrates an example that the interrupt signal INTR is activated in a form of a positive pulse during only the second monitoring period Tm2. The probability of the system irregularity is increased when the frequency of the operating clock signal is set to a higher frequency inappropriately, and then the process 20 may take proper steps in response to the interrupt signal INTR to prevent the system irregularity. For example, when the interrupt signal INTR is activated, the processor 20 may adjust the value of the source clock selection signal, the division ratio, etc. as will be described with reference to FIG. 13 to lower the frequency of the corresponding operating clock signal. Further, the processor 20 may update the set values of the source clock selection signal, the division ratio, etc. to the adjusted value.

A non-limiting example is illustrated in FIG. 12, and the measurement of the detection frequency and the comparison for activating the interrupt signal may be performed selectively with respect to the operating clock signal requiring the clock monitoring. For example, the processor 20 may determine the value of the operating clock selection signal OCS so that the multiplexer 61 may output the operating clock signal as the selected clock signal when a frequency of the operating clock signal is changed or a power level of the function block corresponding to the operating clock signal is changed. In this case, the interrupt signal INTR may indicate the frequency abnormality of the operating clock signal the frequency of which or the power level of the function block corresponding to which is changed.

Figure 13:
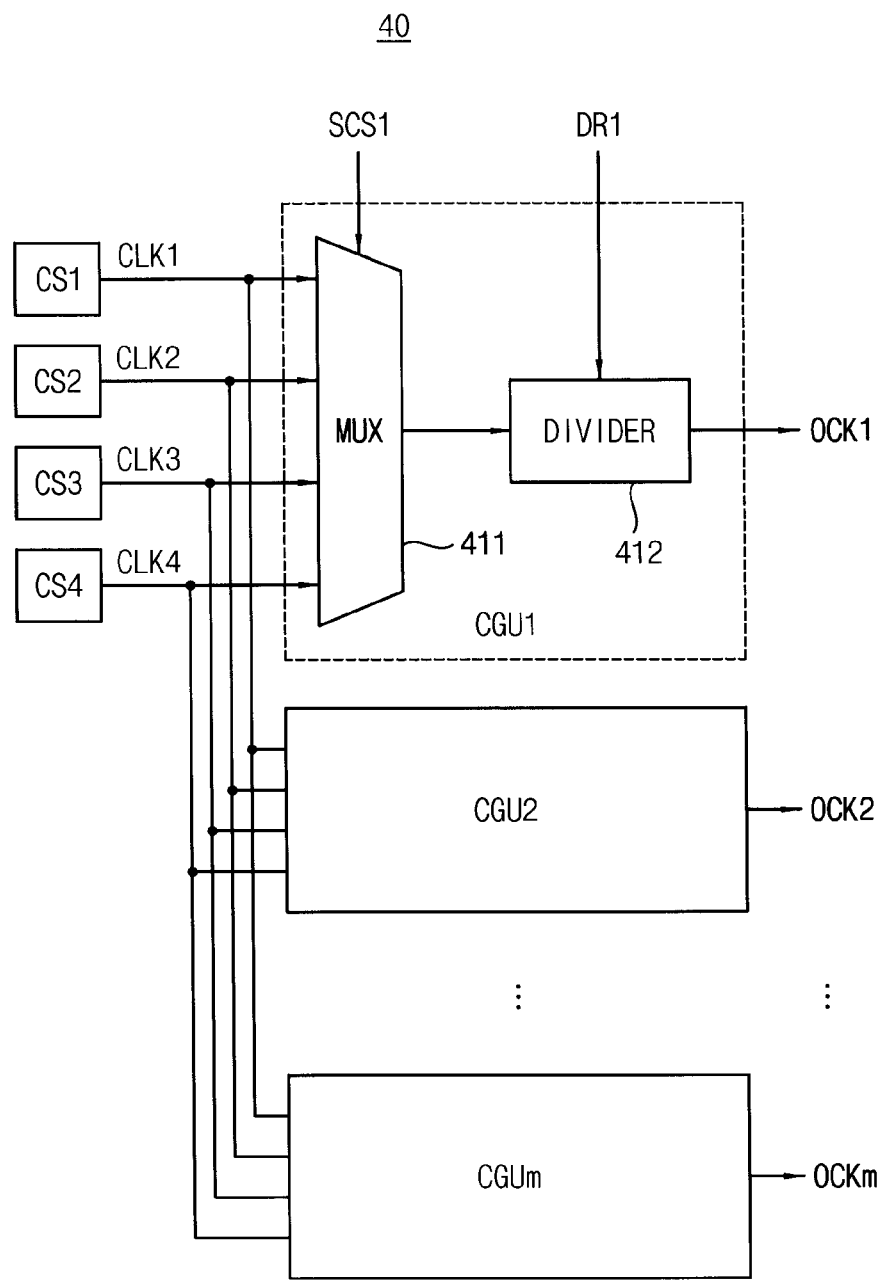
FIG. 13 is a block diagram illustrating an example embodiment of a clock controller included in the system of FIG. 1.

FIG. 13 is a block diagram illustrating an example embodiment of a clock controller included in the system of FIG. 1. Referring to FIG. 13, a clock control unit 40 may include a plurality of clock sources CS1~CS4 and a plurality of clock generating units CGU1~CGUm. The clock sources CS1~CS4 may include crystal oscillators phase-locked loops, etc. to provide source clock signals CLK1~CLK4, respectively. The clock generating units CGU1~CGUm may generate the operating clock signals OCK1~OCKm based on the source clock signals CLK1~CLK4, respectively. The number of the clock sources coupled to each clock generating unit may be different with respect to the clock generating units. At least a portion of the clock sources CS1~CS4 may be disposed out of the clock control unit 40.

For example, the first clock generating unit CGU1 may include a clock multiplexer MUX 411 and a frequency divider 412. The clock multiplexer 411 may select and output one of the source clock signals CLK1~CLK4 from the clock sources CS1~CS4. The frequency divider 412 may divide the frequency of the selected source clock signal to generate the operating clock signal OCK1.

The source clock selection signal SCS1 and the division ratio DR1 may be included in the clock control signal CCTR from the power management unit 30 in FIG. 1. When the interrupt signal INTR is activated, the processor 20 may control the power management unit 30 to change the source clock selection signal SCS1 and/or the division ratio DR1 to reset the frequency of the operating clock signal OCK1. According to example embodiments, the interrupt signal INTR may be provided directly to the power management unit 30 so that the power management unit 30 may change the source clock selection signal SCS1 and/or the division ratio DR1 promptly to prevent the system down.

Figure 14:
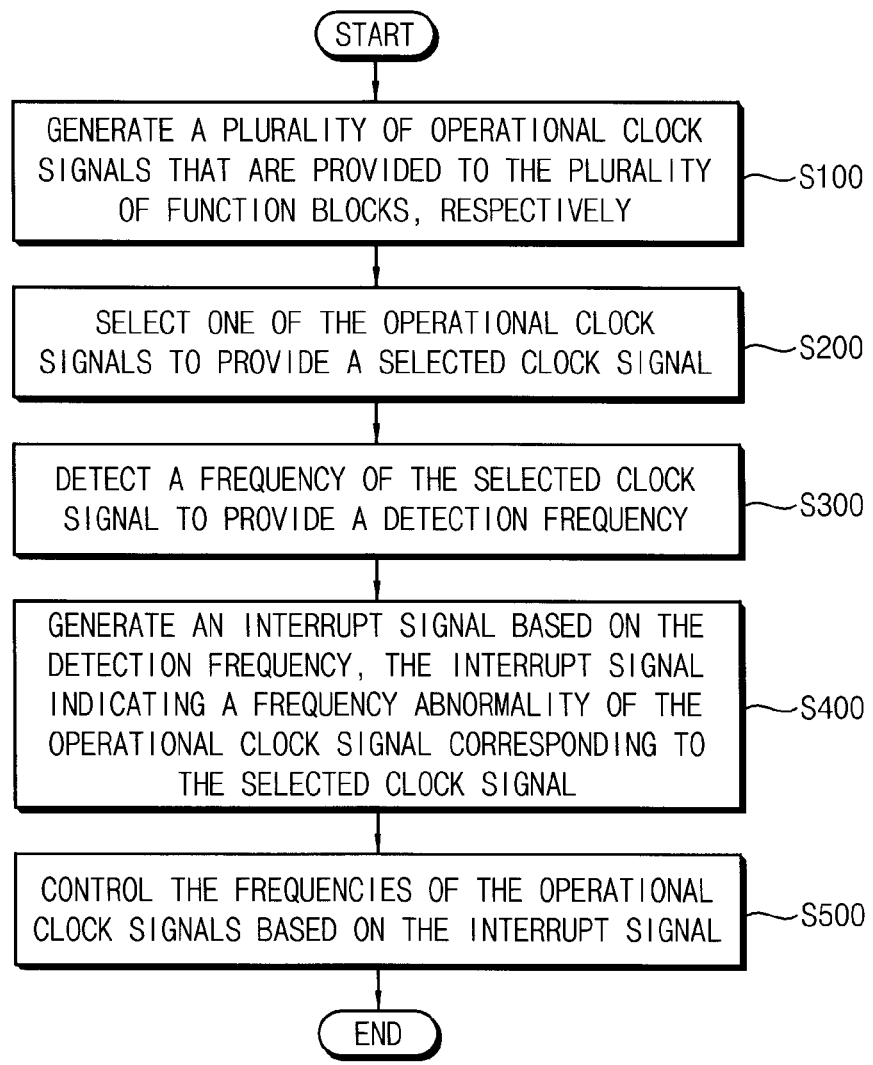
FIG. 14 is a flow chart illustrating a clock monitoring method according to example embodiments.

FIG. 14 is a flow chart illustrating a clock monitoring method according to example embodiments.

Referring to FIGS. 1, 2 and 14, the clock control unit 40 generates a plurality of operating clock signals OCK1~OCKm provided to the plurality of function blocks FB1~FBm, respectively (S100). Under the control of the processor 20 the power management unit 30 may generate the clock control signal CCTR to control the frequencies of the operating clock signals OCK1~OCKm.

The selector 61 in the clock monitor 60 selects one of the operating clock signals OCK1~OCKm to provide a selected clock signal SCK (S200). The selector 61 may include a multiplexer MUX configured to output one of the operating clock signals OCK1~OCKm as the selected clock signal SCK in response to the operating clock selection signal OCS. The operating clock selection signal OCS may be included in the monitor control signal MCTR from the processor 20 in FIG. 1.

The frequency detector 63 detects a frequency of the selected clock signal SCK to provide a detection frequency FDET (S300). The interrupt generator 65 generates the interrupt signal INTR based on the detection frequency FDET, such that the interrupt signal INTR indicates a frequency abnormality of the operating clock signal corresponding to the selected clock signal SCK (S400). The frequency detector 63 and the interrupt generator 65 may be shared with respect to the operating clock signals OCK1~OCKm such that the frequency abnormality of the operating clock signals OCK1~OCKm may be monitored sequentially. The interrupt generator 65 may determine the frequency abnormality of the operation clock signal corresponding to the selected clock signal SCK by reflecting a power level of the function block corresponding to the selected clock signal SCK.

The processor 20 controls the frequencies of the operating clock signals OCK1~OCKm based on the interrupt signal INTR (S500). The probability of the system irregularity is increased when the frequency of at least one operating clock signal is set to a higher frequency inappropriately, and the process 20 may take proper steps in response to the interrupt signal INTR to prevent the system irregularity.

Figure 15:
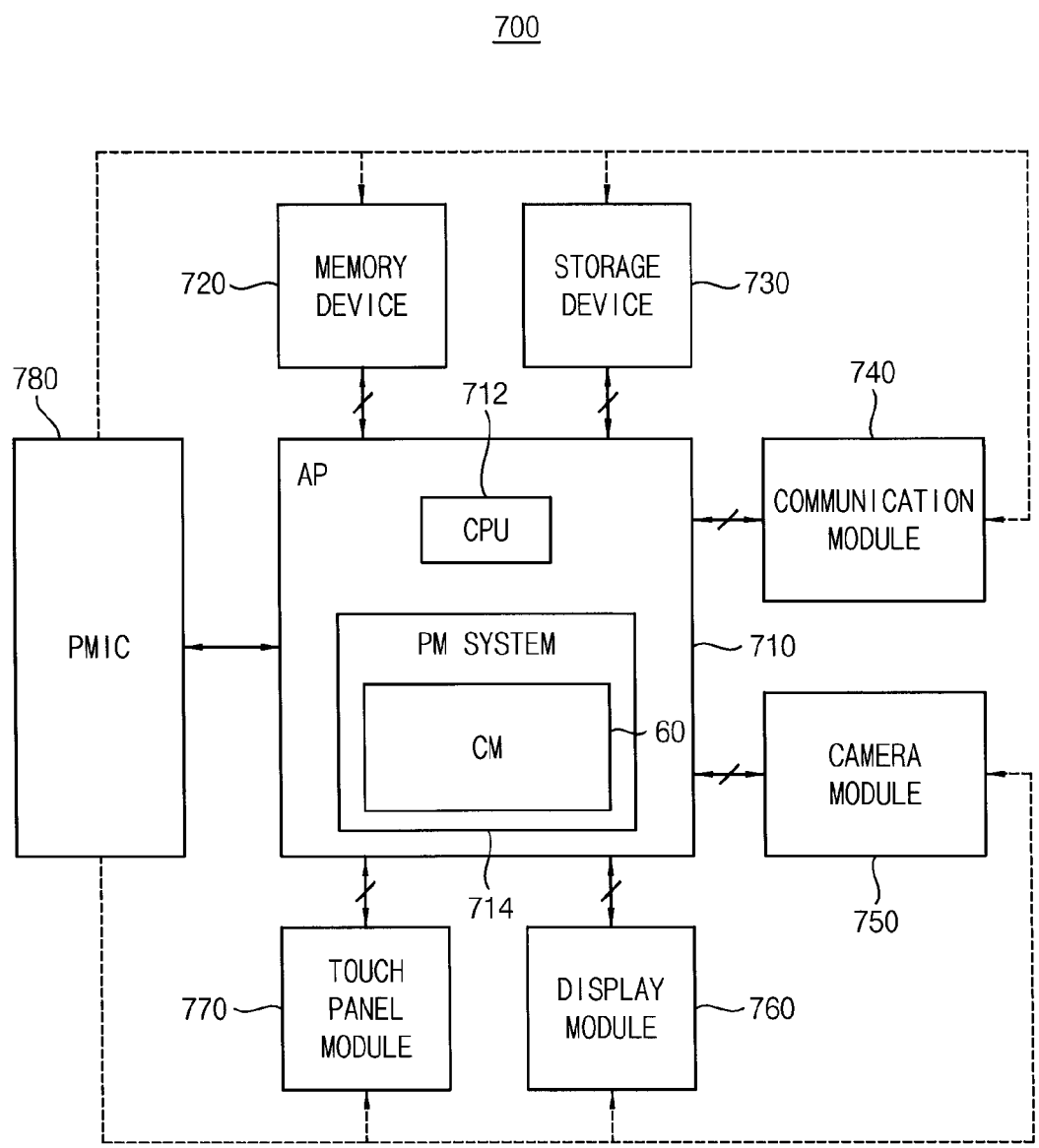
FIG. 15 is a block diagram illustrating a mobile device according to example embodiments.
Figure 16:
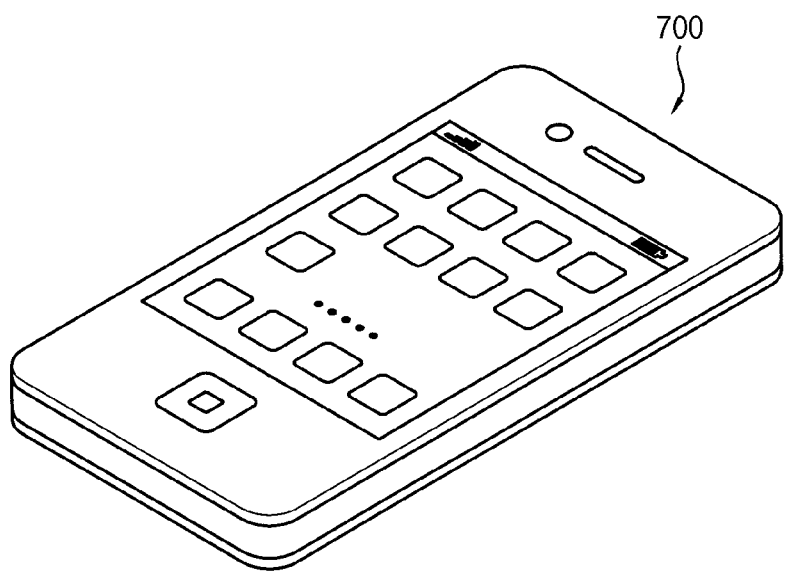
FIG. 16 is a schematic diagram illustrating an example in which the mobile device of FIG. 15 is implemented as a smart-phone.

FIG. 15 is a block diagram illustrating a mobile device according to example embodiments, and FIG. 16 is a schematic diagram illustrating an example in which the mobile device of FIG. 15 is implemented as a smart-phone.

Referring to FIGS. 15 and 16, a mobile device 700 includes a system on chip (SoC) 710 and a plurality of functional modules 740, 750, 760 and 770. The mobile device 700 may further include a memory device 720, a storage device 730 and a power management device 780. For example, as illustrated in FIG. 16, the mobile device 700 may be implemented as a smart-phone.

The SoC 710 controls overall operations of the mobile device 700. For example, the SoC 710 controls the memory device 720, the storage device 730 and the plurality of functional modules 740, 750, 760 and 770. The SoC 710 may be an application processor (AP) that is included in the mobile device 700.

The SoC 710 may be the integrated circuit 10 in FIG. 1. For example, the SoC 710 includes a CPU 712 and a power management system 714. The power management system 714 includes a clock monitor CM 60 according to example embodiments. The clock monitor 60, as described above, includes a selector, a frequency detector and an interrupt generator. The selector selects one of a plurality of operating clock signals to provide a selected clock signal where the plurality of operating clock signals are provided to a plurality of function blocks in the system on chip 710, respectively.

The frequency detector detects a frequency of the selected clock signal to provide a detection frequency. The interrupt generator generates an interrupt signal based on the detection frequency, where the interrupt signal indicates a frequency abnormality of the operating clock signal corresponding to the selected clock signal.

The memory device 720 and the storage device 730 may store data for operations of the mobile device 700. The memory device 720 may include a volatile memory device, such as a dynamic random access memory (DRAM), a SRAM, a mobile DRAM, etc. The storage device 730 may include a nonvolatile memory device, such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. In some example embodiments, the storage device 730 may further include a solid state drive (SSD), a hard disk drive (HDD), a CD-ROM, etc.

The functional modules 740, 750, 760 and 770 perform various functions of the mobile device 700. For example, the mobile device 700 may include a communication module 740 that performs a communication function (e.g., a code division multiple access (CDMA) module, a long term evolution (LTE) module, a radio frequency (RF) module, an ultra-wide-band (UWB) module, a wireless local area network (WLAN) module, a worldwide interoperability for a microwave access (WIMAX) module, etc.), a camera module 750 that performs a camera function, a display module 760 that performs a display function, a touch panel module 770 that performs a touch sensing function, etc. In some example embodiments, the mobile device 700 may further include a global positioning system (GPS) module, a microphone (MIC) module, a speaker module, a gyroscope module, etc. However, the functional modules 740, 750, 760, and 770 in the mobile device 700 are not limited thereto.

The power management device 780 may provide an operating voltage to the SoC 710, the memory device 720, the storage device 730 and the functional modules 740, 750, 760 and 770.

Figure 17:
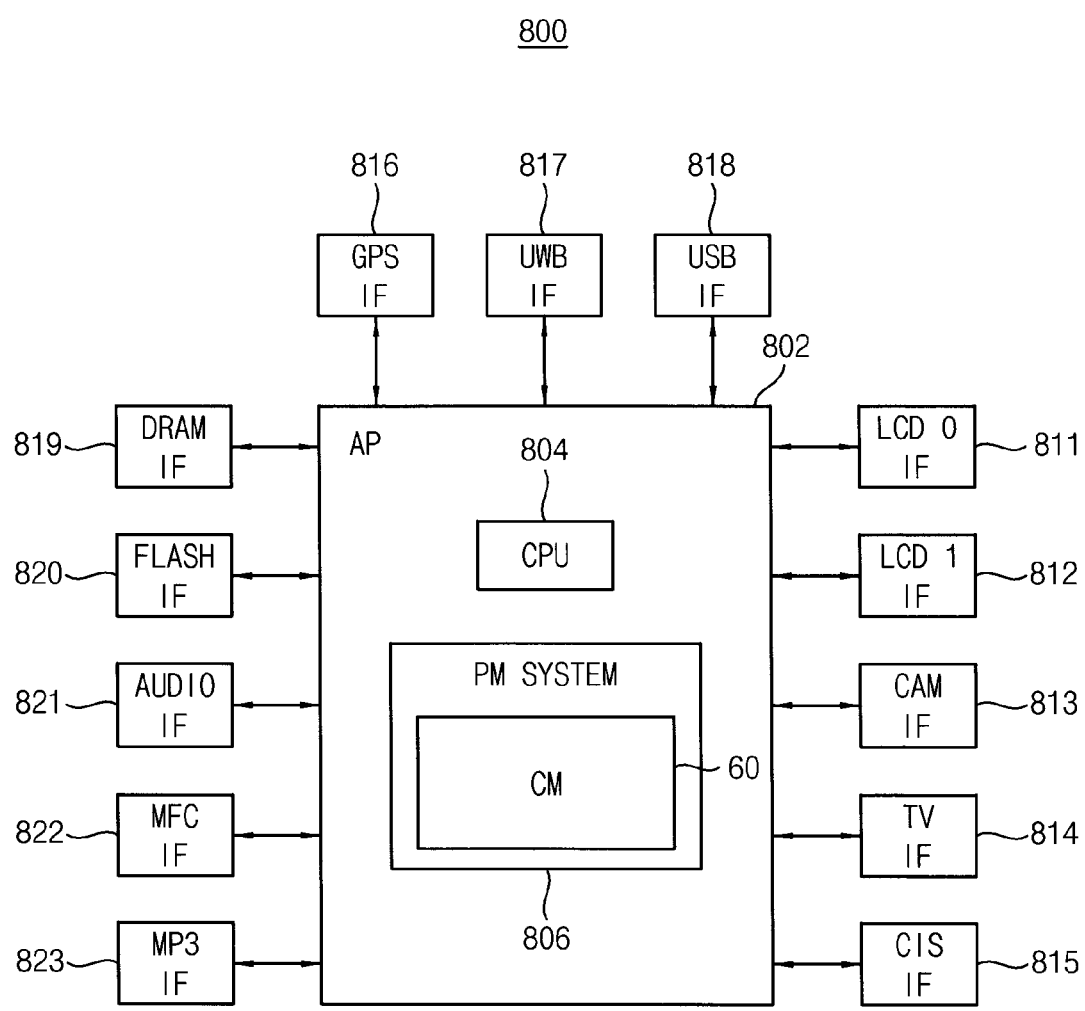
FIG. 17 is a block diagram illustrating an interface included in a mobile device according to example embodiments.

FIG. 17 is a block diagram illustrating an interface included in a mobile device according to example embodiments. Referring to FIG. 17, a mobile device 800 includes an SoC 802 and a plurality of interfaces 811, 812, 813, 814, 815, 816, 817, 818, 819, 820, 821, 822 and 823. According to example embodiments, the mobile device 800 may be any mobile device, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc.

The SoC 802 controls overall operations of the mobile device 800. For example, the SoC 802 may be an application processor (AP) that is included in the mobile device 800. The SoC 802 may communicate with each of a plurality of peripheral devices (not illustrated) via each of the plurality of interfaces 811~823. For example, each of the interfaces 811~823 may transmit at least one control signal, which is output from a respective IP among a plurality of IPs implemented in each of power domains, to each of the plurality of peripheral devices.

For example, the SoC 802 may control a power state and an operation state of each flat panel display device via each of display interfaces 811 and 812. The flat panel display device may include a liquid crystal display (LCD), a light emitting diode (LED) display, an organic light emitting diode (OLED) display or an active matrix organic light-emitting diode (AMOLED) display, etc.

The SoC 802 may control a power state and an operation state of a camcorder via a camcorder interface 813, may control a power state and an operation state of a TV module via a TV interface 814, and may control a power state and an operation state of a camera module or an image sensor module via an image sensor interface 815.

The SoC 802 may control a power state and an operation state of a GPS module via a GPS interface 816, may control a power state and an operation state of a UWB module via a UWB interface 817, and may control a power state and an operation state of an universal serial bus (USB) drive via a USB drive interface 818.

The SoC 802 may control a power state and an operation state of a DRAM via a DRAM interface 819, may control a power state and an operation state of a nonvolatile memory device (e.g., a flash memory) via a nonvolatile memory interface 820 (e.g., a flash memory interface), may control a power state and an operation state of an audio module through an audio interface 821, may control a power state of a multi-format codec (MFC) through an MFC interface 822, and may control a power state of an MP3 player through an MP3 player interface 823. For example, a module or an interface may be implemented in hardware or software.

The SoC 802 may be the integrated circuit 10 in FIG. 1. For example, the SoC 802 includes a CPU 804 and a power management system 806. The power management system 806 includes a clock monitor CM 60 according to example embodiments. The clock monitor 60, as described above, includes a selector, a frequency detector and an interrupt generator. The selector selects one of a plurality of operating clock signals to provide a selected clock signal where the plurality of operating clock signals are provided to a plurality of function blocks in the system on chip 802, respectively. The frequency detector detects a frequency of the selected clock signal to provide a detection frequency. The interrupt generator generates an interrupt signal based on the detection frequency, where the interrupt signal indicates a frequency abnormality of the operating clock signal corresponding to the selected clock signal.

Figure 18:
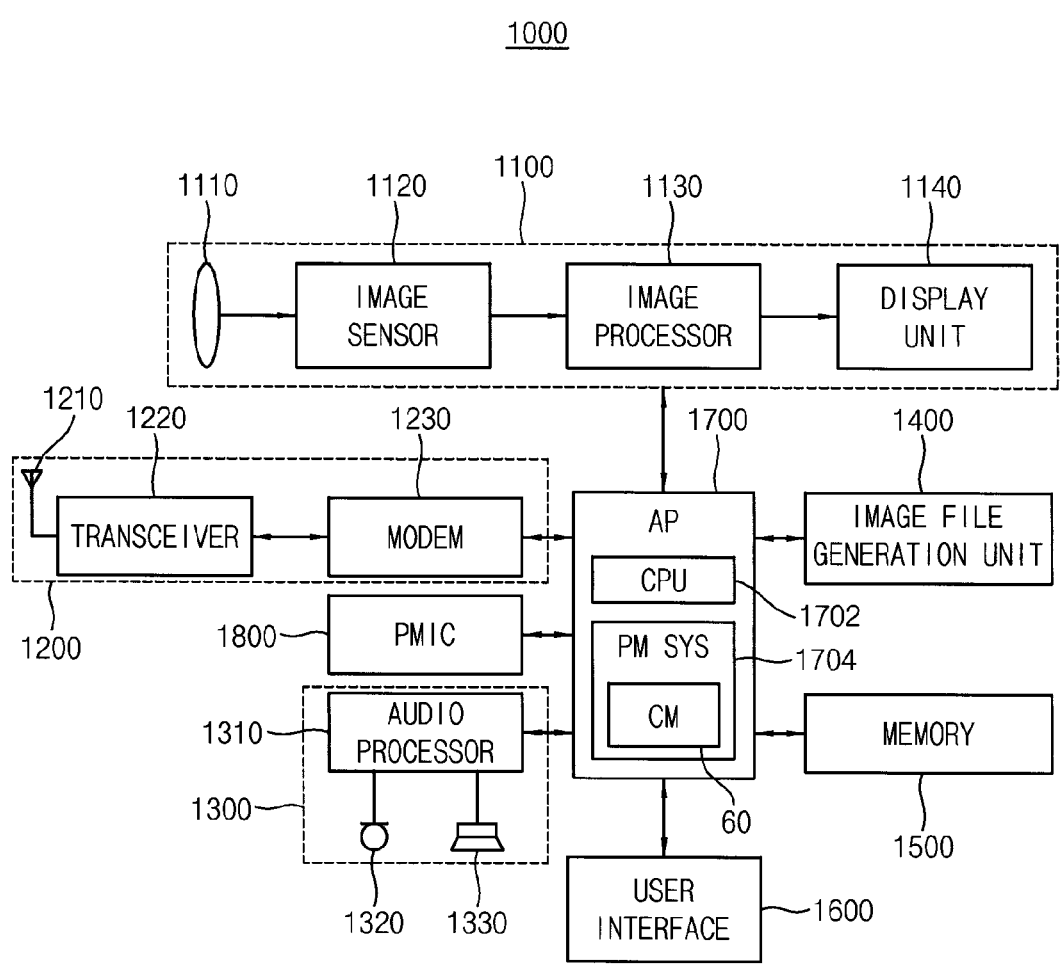
FIG. 18 is a block diagram illustrating a portable terminal according to example embodiments.

FIG. 18 is a block diagram illustrating a portable terminal according to example embodiments. Referring to FIG. 18, a portable terminal 1000 includes an image processing block 1100, a wireless transceivng block 1200, an audio processing block 1300, an image file generation unit 1400, a memory device 1500, a user interface 1600, an application processor 1700 and a power management device 1800.

The image processing block 1100 may include a lens 1110, an image sensor 1120, an image processor 1130 and a display unit 1140. The wireless transceiving block 1200 may include an antenna 1210, a transceiver 1220 and a modem 1230. The audio processing block 1300 may include an audio processor 1310, a microphone 1320 and a speaker 1330.

The portable terminal 1000 may include various kinds of semiconductor devices. The application processor 1700 may require low power consumption and high performance. The application processor 1700 may include multiple cores. The application processor 1700 may be the integrated circuit 10 in FIG. 1. For example, the application processor 1700 includes a CPU 1702 and a power management system 1704. The power management system 1704 includes a clock monitor CM 60 according to example embodiments. The clock monitor 60, as described above, includes a selector, a frequency detector and an interrupt generator. The selector selects one of a plurality of operating clock signals to provide a selected clock signal where the plurality of operating clock signals are provided to a plurality of function blocks in the application processor 1700, respectively. The frequency detector detects a frequency of the selected clock signal to provide a detection frequency. The interrupt generator generates an interrupt signal based on the detection frequency, where the interrupt signal indicates a frequency abnormality of the operating clock signal corresponding to the selected clock signal.

The power management device 1800 may provide an operating voltage to the image processing block 1100, the wireless transceivng block 1200, the audio processing block 1300, the image file generation unit 1400, the memory device 1500, the user interface 1600 and the application processor 1700.

The clock monitor and the system on chip including the clock monitor according to example embodiments may enhance the performance of the system without excessive increase of the system size by monitoring the plurality of operating clock signals using common hardware. In addition, the clock monitor and the system on chip including the clock monitor according to example embodiments may monitor the operating clock signals accurately by reflecting the changes of the power level according to the DVFS scheme. Furthermore, the clock monitor and the system on chip including the clock monitor according to example embodiments may perform efficient clock monitoring, even when the frequency of the operating clock signal is relatively high, by counting the divided operating clock signal.

The example embodiments disclosed herein may be used in various kinds of SoCs or a system including the SoCs, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible to the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock monitor comprising:
   a selector configured to select one of a plurality of operating clock signals to provide a selected clock signal, the plurality of operating clock signals being provided to a plurality of function blocks, respectively;
   a frequency detector configured to detect a frequency of the selected clock signal to provide a detection frequency; and
   an interrupt generator configured to generate an interrupt signal based on the detection frequency, the interrupt signal indicating a frequency abnormality of the operating clock signal corresponding to the selected clock signal.

2. The clock monitor of claim 1, wherein the selector includes a multiplexer configured to output one of the operating clock signals as the selected clock signal in response to an operating clock selection signal.

3. The clock monitor of claim 2, wherein a value of the operating clock selection signal is changed sequentially and the multiplexer is configured to output the operating clock signals sequentially as the selected clock signal.

4. The clock monitor of claim 3, wherein the interrupt signal indicates the frequency abnormality of the operating clock signals sequentially.

5. The clock monitor of claim 2, wherein a value of the operating clock selection signal is determined such that the multiplexer outputs the operating clock signal as the selected clock signal when one of a frequency of the operating clock signal is changed and a power level of the function block corresponding to the operating clock signal is changed.

6. The clock monitor of claim 5, wherein the interrupt signal indicates the frequency abnormality of the operating clock signal in which one of the frequency and the power level of the function block corresponding thereto is changed.

7. The clock monitor of claim 1, wherein the frequency detector and the interrupt generator are shared with respect to the operating clock signals such that the frequency abnormality of the operating clock signals is monitored sequentially.

8. The clock monitor of claim 1, wherein the frequency detector is configured to divide the frequency of the selected clock signal to provide the detection frequency.

9. The clock monitor of claim 1, wherein the interrupt generator is configured to determine the frequency abnormality of the operating clock signal corresponding to the selected clock signal by reflecting a power level of the function block corresponding to the selected clock signal.

10. The clock monitor of claim 1, wherein the frequency detector includes:
    a frequency divider configured to divide the frequency of the selected clock signal to generate a divided clock signal;
    a count enable signal generator configured to generate a count enable signal based on a reference clock signal;
    a clock counter configured to count a clock number of the divided clock signal during an activation time interval of the count enable signal to provide a count value; and
    a detection frequency calculator configured to calculate the detection frequency based on the count value.

11. The clock monitor of claim 10, wherein the frequency divider includes at least one flip-flop configured to divide the frequency of the selected clock signal to generate at least one clock signal having a frequency lower than the frequency of the selected clock signal.

12. The clock monitor of claim 10, wherein the frequency divider includes:
    a first flip-flop configured to receive the selected clock signal and generate a first clock signal having a frequency corresponding to half the frequency of the selected clock signal;
    a second flip-flop configured to receive the first clock signal and generate a second clock signal having a frequency corresponding to half the frequency of the first clock signal; and
    a multiplexer configured to select one of the selected clock signal, the first clock signal and the second clock signal to output as the divided clock signal in response to a division ratio selection signal.

13. The clock monitor of claim 10, wherein the count enable signal generator is configured to generate the count enable signal such that the activation time interval of the count enable signal corresponds to k times of a cyclic period of the reference clock signal where k is a positive integer.

14. The clock monitor of claim 10, wherein the detection frequency calculator is configured to calculate the detection frequency based upon equation Fd=Fr*S*N/T where Fd is the detection frequency of the operating clock frequency corresponding to the selected clock signal, Fr is a frequency of the reference clock signal, S is a division ratio of the frequency divider, N is the count value and T is the activation time interval of the count enable signal.

15. The clock monitor of claim 1, wherein the interrupt generator includes:
 a storage unit configured to store values of an implemented frequency corresponding to the operating clock signals respectively and scaling values corresponding to power levels of the function blocks respectively;
 a reference frequency calculator configured to extract the value of the implemented frequency and the scaling value corresponding to the selected clock signal from the storage unit and calculate a reference frequency based on the extracted value of the implemented frequency and the extracted scaling value; and
 a comparator configured to compare the reference frequency and the detection frequency to generate the interrupt signal.

16. The clock monitor of claim 15, wherein the comparator is configured to activate the interrupt signal when the detection frequency is higher than the reference frequency.

17. The clock monitor of claim 15, wherein the storage unit stores values of the detection frequency detected by the frequency detector such that an external processor refers to the values of the detection frequency.

18. A system on chip comprising:
 a plurality of function blocks configured to perform predetermined functions, respectively;
 a clock control unit configured to generate a plurality of operating clock signals that are provided to the plurality of function blocks, respectively;
 a clock monitor configured to monitor frequencies of the operating clock signals to generate an interrupt signal; and
 a processor configured to control the frequencies of the operating clock signals based on the interrupt signal;
 the clock monitor comprising
  a selector configured to select one of the operating clock signals to provide a selected clock signal,
  a frequency detector configured to detect a frequency of the selected clock signal to provide a detection frequency, and
  an interrupt generator configured to generate the interrupt signal based on the detection frequency, the interrupt signal indicating a frequency abnormality of the operating clock signal corresponding to the selected clock signal.

19. The system on chip of claim 18, wherein the processor is configured to reset the frequency of the operating clock signal corresponding to the selected clock signal when the interrupt signal is activated.

20. A system on chip configured to operate based on a plurality of operating clock signals, the system on chip comprising:
 a clock monitor configured to monitor frequencies of the operating clock signals to generate an interrupt signal, the clock monitor comprising
  a selector configured to select one of the operating clock signals to provide a selected clock signal,
  a frequency detector configured to detect a frequency of the selected clock signal to provide a detection frequency, and
  an interrupt generator configured to generate the interrupt signal based on the detection frequency, the interrupt signal indicating a frequency abnormality of the operating clock signal corresponding to the selected clock signal.

* * * * *